United States Patent [19]

Kolar et al.

[11] Patent Number: 5,162,259
[45] Date of Patent: Nov. 10, 1992

[54] METHOD FOR FORMING A BURIED CONTACT IN A SEMICONDUCTOR DEVICE

[75] Inventors: David G. Kolar; Robert E. Jones, both of Austin, Tex.

[73] Assignee: Motorola, Inc., Schaumburg, Ill.

[21] Appl. No.: 650,101

[22] Filed: Feb. 4, 1991

[51] Int. Cl.$^5$ .................... H01L 21/44; H01L 21/48
[52] U.S. Cl. ................... 437/192; 437/193; 437/200
[58] Field of Search .............. 156/648, 644; 148/DIG. 50; 437/192, 200, 195, 203, 228, 245

[56] References Cited

U.S. PATENT DOCUMENTS

| | | | |
|---|---|---|---|
| 4,289,574 | 9/1981 | Radigan et al. | 432/187 |
| 4,551,908 | 11/1985 | Nagasawa et al. | 148/DIG. 19 |
| 4,966,864 | 10/1990 | Pfiester | 437/191 |
| 4,992,394 | 2/1991 | Kostelak, Jr. et al. | 437/200 |

FOREIGN PATENT DOCUMENTS

| | | | |
|---|---|---|---|
| 55-039674 | 3/1980 | Japan | 437/187 |
| 57-104241 | 6/1982 | Japan | 437/187 |
| 1-241125 | 9/1989 | Japan | 437/200 |
| 2-097016 | 4/1990 | Japan | 437/187 |

Primary Examiner—Olik Chaudhuri
Assistant Examiner—Loc Q. Trinh
Attorney, Agent, or Firm—Jasper W. Dockrey

[57] ABSTRACT

A process for forming a buried contact (50) in a semiconductor device (20) which avoids etch damage to the substrate and forms a self-aligned, low resistance contact to a silicon substrate (22) is provided. After forming a contact opening (32) through overlying insulating and conducting layers (24, 28, 30), a silicide region (40) is formed in the substrate at the contact surface (34) exposed by the contact opening (32). A refractory metal silicide which provides high etching selectivity to polysilicon is formed in the substrate at the contact surface (34) by either a blanket deposition of a refractory metal into the contact opening (32), or alternatively, by a selective deposition process using contact surface (34) as a nucleation site. In a preferred embodiment, a cobalt or tantalum silicide region (40) is formed in the substrate at the contact surface (34) and a conductive layer (42) is deposited and etched to form an interconnect (48) contacting the silicide region (40). The high etching selectivity obtainable between the conductive layer (42) and the silicide region (40) avoids damage to the substrate surface providing improved device performance.

8 Claims, 3 Drawing Sheets

METHOD FOR FORMING A BURIED CONTACT IN A SEMICONDUCTOR DEVICE

FIELD OF THE INVENTION

This invention relates in general to a method for fabricating a semiconductor device, and more particularly to a method for forming buried contacts in a semiconductor device.

BACKGROUND OF THE INVENTION

Buried contacts have been extensively used in CMOS memory circuits. A CMOS SRAM cell employing a load resistor and cross-coupled transistors utilizes buried contacts to connect each gate electrode to the drain of the opposing cross-coupled transistor. In a typical cell layout, the active regions of the cross-coupled transistors also serve as the drain regions of pass transistors which provide access from the bit lines to the memory cell. The buried contacts provide a means of making an electrical connection between the polysilicon gates and the common active region of the cross-coupled and pass transistors. Additionally, to facilitate the construction of a gate-lead cross over, the electrical path of one of the leads is re-routed to the substrate using a buried contact.

A typical process sequence for the formation of a buried contact, in accordance with the prior art, is illustrated in FIGS. 1a through 1c. Shown in FIG. 1a, in cross section, is a P-type semiconductor substrate 5 having undergone some of the process steps in the fabrication of a semiconductor device. A gate oxide layer 7 overlying the surface of substrate 5 is patterned using resist mask 8 and etched to form an opening 9 exposing a portion of the substrate for the formation of a buried contact. An ion implantation is performed to create an N-type drain region 10 in substrate 5 using resist mask 8 as an implant mask. Resist mask 8 is removed and a layer of polysilicon 12 is then conformably deposited onto substrate 5 as shown in FIG. 1b. Subsequently, polysilicon layer 12 is patterned and etched, by reactive ion etching, to form a transistor gate electrode 14 making electrical contact 15 with drain region 10, as shown in FIG. 1c. Electrode 14 can also be a polysilicon extension of a remote transistor gate electrode, for example, as in a CMOS SRAM cell. A trench 16 has been formed in substrate 5 during the etching process used to form gate electrode 14 because of the poor selectivity of the etch process. The selectivity of an etch process is defined as the ratio of the etch rates of the material to be etched versus the underlying material. The reactive ion etch gases used to etch polysilicon layer 12 will also etch the single crystal silicon of substrate 5 at about the same rate, or equivalently, the selectivity of polysilicon to single crystal silicon is about 1:1. The formation of trench 16 is undesirable because a pathway is now present for charge leakage to occur between the P-type substrate and N-type drain region 10.

An additional problem associated with the formation of trench 16 is the uneven substrate surface topography created adjacent to contact 15, as illustrated in FIG. 1c. The additional topographic contrast presented by trench 16 can result in poor overlay continuity of subsequently formed electrical leads. The topographic discontinuity problem can become even more severe if sidewall spacers are formed, for example, as in a lightly-doped drain (LDD) formation process.

BRIEF SUMMARY OF THE INVENTION

In practicing the present invention there is provided a buried contact formation process which substantially reduces etch damage and trenching of the substrate. In one embodiment of the invention, a silicon substrate is provided having a dielectric layer, a first conductive layer and an insulating layer formed sequentially thereon. An opening is formed through the insulating layer, the first conductive layer, and the dielectric layer exposing a contact region at the surface of the silicon substrate. A refractory metal silicide region is formed in the contact region and the insulating layer overlying the first conductive layer is removed. A second conductive layer is deposited onto the first conductive layer and the refractory metal silicide. The second conductive layer is selectively etched preferentially to the refractory metal silicide to form a portion thereof making an electrical contact to the substrate and leaving exposed a portion of the refractory metal silicide.

Figure 1A:
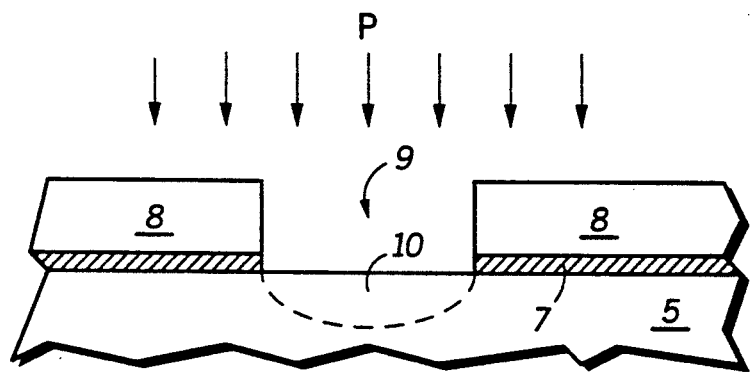
FIGS. 1a–1c illustrate, in cross section, the formation of a buried contact according to the prior art.
Figure 1B:
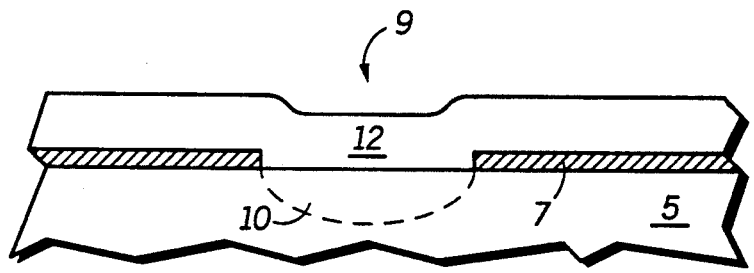
Figure 1C:
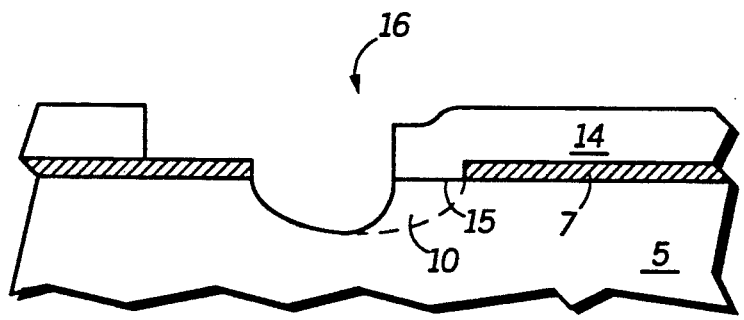

It will be appreciated that for simplicity and clarity of illustration elements shown in the FIGURES have not necessarily been drawn to scale. For example, the dimensions of some of the elements are exaggerated relative to each other for clarity. Further, where considered appropriate, reference numerals have been repeated among the FIGURES to indicate corresponding elements.

DETAILED DESCRIPTION OF THE INVENTION

Figure 2:
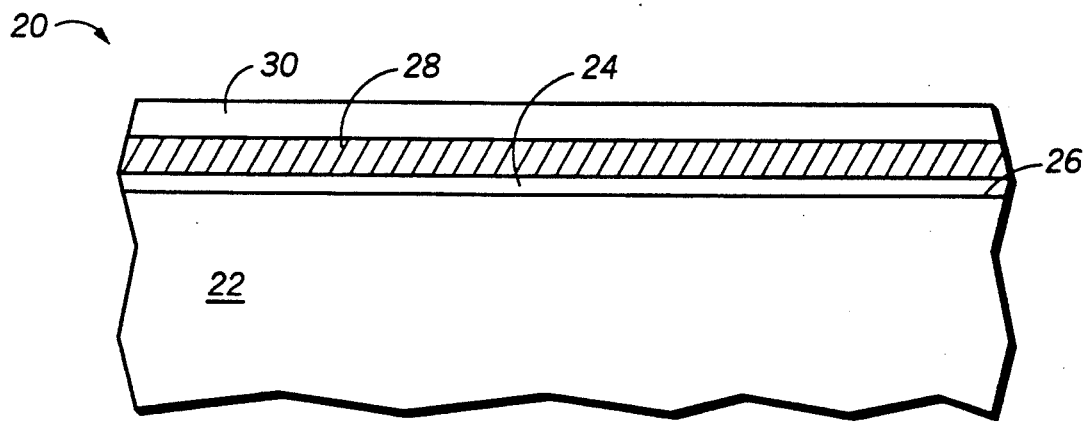
FIGS. 2–6 illustrate, in cross section, process steps in accordance with the invention.

Shown in FIG. 2 is a portion of a semiconductor device 20 having already undergone several process steps in accordance with the invention. Semiconductor device 20 includes a silicon substrate 22 having a dielectric layer 24 formed on a principal surface 26 of silicon substrate 22. A first conductive layer 28 overlies dielectric layer 24 and an insulating layer 30 overlies first conductive layer 28. Silicon substrate 22 can be a single crystal silicon body, or alternatively, an epitaxial silicon body. Substrate 22 is doped with an impurity atom such as phosphorus, arsenic or boron or the like to impart an N-type or P-type electrical conductivity to the substrate. To form an N-channel device, for example, substrate 22 is preferably single crystal silicon doped with boron to impart a P-type conductivity. Dielectric layer 24 is preferably silicon oxide formed by the thermal oxidation of principal surface 26. Alternatively, other dielectric materials can be used, such as a composite material comprising silicon oxide-silicon nitride-silicon oxide (ONO) formed by the combined processes of chemical vapor deposition (CVD) and thermal oxidation. First conductive layer 28 is preferably polycrystalline silicon (polysilicon) deposited by CVD. First conductive layer 28 is used to protect dielectric layer 24 overlying portions of substrate 22 not shown from contamination and physical degradation from fabrication steps such as ion implantation and chemical etching. Alternatively, first conductive layer 28 can be formed from other conductive materials such as copper or titanium nitride. Additional materials include a refractory metal or a refractory metal silicide and the like.

As used herein, a refractory metal is any of the high temperature enduring transition metals including tungsten, molybdenum, cobalt, titanium, platinum, tantalum and the like. Insulating layer 30 can be any material differentially etchable with respect to the chosen refractory metal. Such materials include various nonelectrically conductive materials such as oxides and nitrides. In a preferred embodiment, insulating layer 30 is silicon nitride deposited by CVD to a thickness of about 50 to 70 nanometers.

Figure 3:
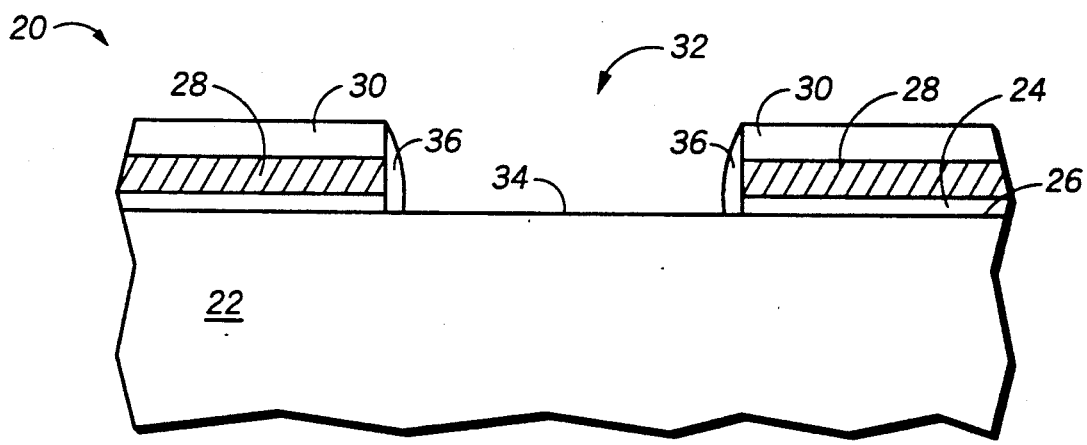

The process is continued, as further illustrated in FIG. 3, by forming a contact opening 32 through layers 24, 28 and 30 exposing a contact surface 34 on principal surface 26. Contact opening 32 is formed by photolithographically patterning and sequentially etching insulating layer 30, first conductive layer 28 and finally, dielectric layer 24. The sequential etch can be carried out using a plasma etching process to etch all layers, or alternatively, the etching can be carried out by a combination of plasma etching and liquid chemical etching. Preferably, a multi-chamber plasma etching apparatus is used perform the etching of each layer. Specific etching gases are used in each chamber of the apparatus to selectively and anisotropically etch each layer. Anisotropic etching is an etch process usually carried out in a reactive-ion-etch (RIE) reactor using a combination of etch gases, and reactor conditions, which result in more rapid etching of a material in the vertical direction than the horizontal direction. The directionality of the anisotropic RIE process results in the formation of structures having substantially vertical walls. Additionally, etch gases are chosen which will react with the material to be etched much more rapidly than the material present in an underlying layer. The etch rate differential between the layer to be etched and the underlying substrate is defined as the selectivity of the etch. For example, in a preferred embodiment in which insulating layer 30 is silicon nitride, first conductive layer 28 is polysilicon and dielectric layer 24 is silicon oxide, one of a number of fluorinated hydrocarbon gases, such as $C_2F_6$, $CF_4$ and the like in combination with $CHF_3$, can used in the first chamber to anisotropically etch the silicon nitride preferentially to polysilicon. Next, the second etch chamber uses chlorine based reactive etch gases, such as HCl and $Cl_2$ to anisotropically etch the polysilicon and expose the underlying silicon oxide. Finally, the silicon oxide is etched using a gas mixture including a fluorinated hydrocarbon gas and oxygen. Those skilled in the art will recognize that, depending upon the specific material used to form the layers, other etching techniques can be used in various combinations to sequentially etch insulating layer 30 and first conductive layer 28.

After forming contact opening 32, the process is continued in accordance with the invention by depositing a thin layer of spacer forming material overlying insulation layer 30 and extending into contact opening 32. The spacer forming material is a dielectric material differentially etchable with respect to single crystal silicon. In a preferred embodiment, the spacer forming material is silicon nitride CVD deposited to a thickness of about 10 to 20 nanometers. The spacer forming material is anisotropically etched such as by RIE etching, to form a sidewall spacer 36 on the sides of contact opening 32. Sidewall spacer 36 covers the edge of first conductive layer 28 exposed by the contact etch sealing the edge from the effects of subsequent process steps. Because the material layer used to form sidewall spacer 36 is relatively thin compared to other layers such as insulating layer 30, only a brief anisotropic etch is necessary to form the spacer and a minimal overetch is used to clear the spacer forming material away from central portion of contact surface 34 the contact surface. The minimal overetch removes a small amount of insulating layer 30.

Figure 4:
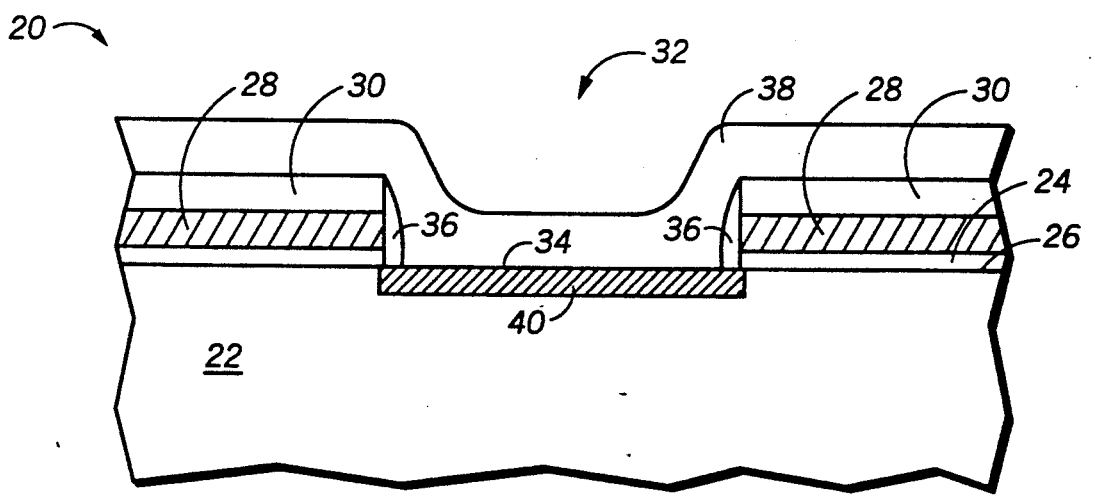

Following the formation of contact opening 32 and sidewall spacer 36, a refractory metal layer 38 is deposited overlying insulating layer 30, sidewall spacer 36 and contact surface 34, as shown in FIG. 4. The selection of the particular refractory metal used to will depend upon the specific processing conditions used during device fabrication. For example, the selected refractory metal must form a silicide having a low etch rate in etching chemistries used to etch overlying conductive layers and be resistant to chemicals used in predeposition cleaning steps. In a preferred embodiment cobalt, or alternatively, tantalum metal is used to form an etch resistant silicide material in contact surface 34. A silicide region 40 is formed by blanket deposition of cobalt or alternatively tantalum, onto the surface of semiconductor device 20, followed by a two step rapid-thermal-annealing (RTA) process. In the first annealing step a relatively low temperature anneal is used that is sufficient to induce a reaction between the refractory metal and silicon in the substrate but is not sufficient to induce a reaction between the refractory metal and silicon present in insulating layer 30, nor any additional insulating materials which may be in contact with refractory metal layer 38.

The annealing times and temperatures are selected as appropriate for the particular refractory metal chosen. For example, in the case in which cobalt silicide is formed, annealing step one is performed at a temperature of about 430° to 470° C. for about 10 to 60 seconds in a nitrogen ambient to form silicide region 40. After forming silicide region 40, the unreacted portion of refractory metal layer 38 is removed by an isotropic etch process such as a selective wet chemical etch or an isotropic plasma etch. A second annealing step is then performed at a higher temperature than the first annealing step to provide complete conversion of the silicide to the high temperature phase and to stabilize silicide region 40. Annealing step two is performed at a temperature of about 650° to 750° C. for about 10 to 60 seconds.

During the silicide formation process, the reaction of cobalt and silicon consumes a portion of the silicon substrate. As a result of silicon consumption the reaction propagates into the substrate away from the immediate area of contact between refractory metal layer 38 and contact surface 34. Experiments using an initial cobalt layer having a thickness of about 25 nanometers have shown that the silicide formation reaction will proceed laterally away from contact opening 32 under sidewall spacer 36 a distance of about 25 to 45 nanometers. The lateral propagation of the silicide forming reaction forms cobalt silicide in substrate 22 a sufficient distance from the area of direct contact by refractory metal layer 38 such that silicide region 40, in addition to extending into substrate 22 a distance of about 90 nanometers, also extends laterally in the portion of substrate 22 underlying sidewall spacer 36, as shown in FIG. 4.

Silicide region 40 creates a region of low electrical resistance in substrate 22 which can be contacted by an overlying conductive layer to form a low resistance electrical contact to substrate 22. Using the process of the present invention, silicide region 40 is fully self-aligned to contact surface 34 as a result of the selective silicide formation process. From the forgoing it should be evident that the formation of an ohmic contact is made without an additional photomasking step to align the silicide region to the contact opening.

Once the formation of silicide region 40 is complete, insulation layer 30 and sidewall spacer 36 are removed by an isotropic etch. In the preferred embodiment wherein insulation layer 30 is silicon nitride and sidewall spacer 36, the isotropic etch is performed in a wet chemical bath using an aqueous phosphoric acid solution. Alternatively, in the case in which insulation layer 30 is silicon oxide and silicide region 40 is cobalt silicide, a dilute aqueous hydrofluoric acid solution buffered with ammonium fluoride and including a surfactant such as ethylene glycol can be used. In certain processing situations it may be advantageous to perform an extended cleaning of the surface of semiconductor device 20 prior to the deposition of overlying conductive layers. In cases where the contact surface 34 is to be exposed to cleaning using a hydrofluoric acid solution, silicide region 40 is preferably tantalum silicide.

Figure 5:
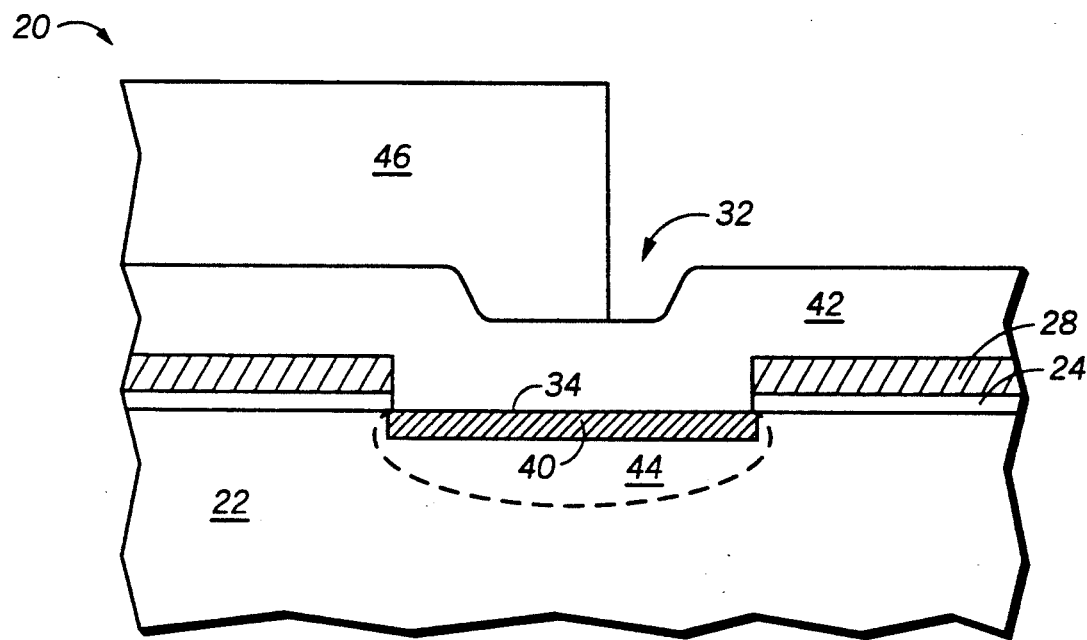

The process continues with the deposition of a second conductive layer 42 onto first conductive layer 28 and silicide region 40, as illustrated in FIG. 5. Second conductive layer 42 extends into contact opening 32 and is in intimate contact with silicide region 40. In a preferred embodiment, second conductive layer 42 is polysilicon formed by CVD deposition. The polysilicon is heavily doped with an N-type dopant such as phosphorus to create a low electrical resistance film. The doping can be performed during the CVD deposition process by introducing phosphorus containing gases in the CVD system at the time of film deposition. Alternatively, the polysilicon can be doped after deposition in a separate doping and annealing process. Following formation of second conductive layer 42, semiconductor device 20 is annealed at about 900° to 950° C. for about 15 to 60 minutes to diffuse dopant atoms from second conductive layer 42 through silicide region 40 and into substrate 22. The diffusion of dopant atoms through silicide region 40 forms a shallow heavily doped region 44 in substrate 22 surrounding silicide region 40. A photolithographic mask 46 is then formed on second conductive layer 42 and aligned to contact surface 34.

It will be apparent to those skilled in the art that other process techniques can be used to form heavily doped region 44. For example, after forming contact opening 32 as shown in FIG. 3, dopant atoms can be ion implanted into substrate 22 through contact surface 34. Silicide region 40 is then formed in the heavily doped substrate.

Figure 6:
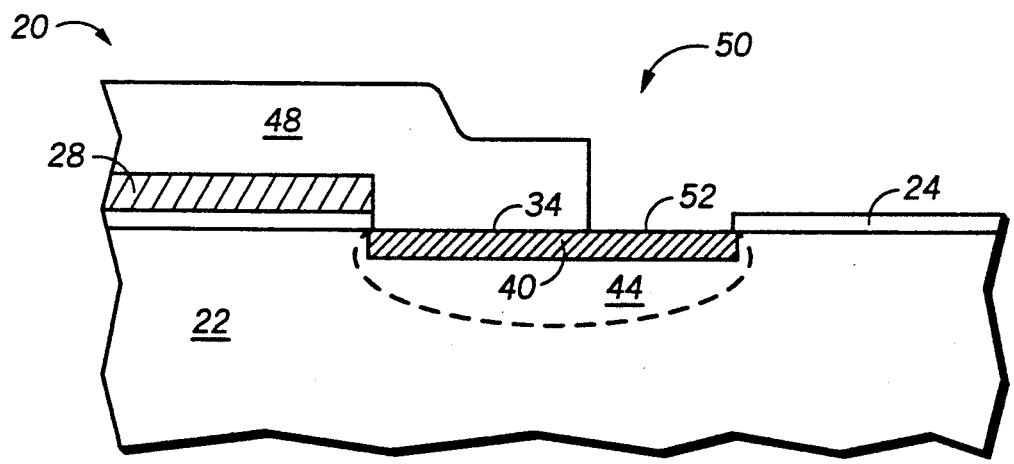

As illustrated in FIG. 6, an interconnect 48 is formed by anisotropically etching second conductive layer 42 and first conductive layer 28 using photolithographic mask 46 as an etch mask. Photolithographic mask 46 is then removed completing the formation of a buried contact 50. It is important to note that photolithographic mask 46, shown in FIG. 5, is aligned to selected surface portion 34 such that, when interconnect 48 is formed, the interconnect will not completely cover contact opening 32. After forming interconnect 48, a portion 52 of contact surface 34 is exposed in buried contact 50. It is important that interconnect 48 not completely cover contact surface 34 because during subsequent processing steps it is necessary to form low electrical resistance regions such as source and drain regions in substrate 22 adjacent to buried contact 50. If interconnect 48 were to completely cover contact surface 34 a high concentration of dopant atoms, introduced by, for example, ion implantation into substrate 22 during formation of the source and drain regions, could not be achieved because of the dopant masking action created by interconnect 48. Thus, to avoid a substrate region having high electrical resistance near buried contact 50, only a portion of contact surface 34 is covered by interconnect 48.

In the preferred embodiment, polysilicon is etched preferentially to cobalt or tantalum silicide in a reactive ion etching apparatus using chlorinated and brominated etch gases. The etch selectivity between polysilicon and cobalt silicide and tantalum silicide is sufficiently large such that the polysilicon is completely etched while only a small amount of silicide is removed. The silicide region 40 and dielectric layer 24 provide an effective etch-stop during formation of interconnect 48. When forming interconnect 48, it is important to remove all portions of second conductive layer 48 and first conductive layer 28 not protected by photolithographic mask 46. Residual conductive material remaining on the surface of semiconductor device 20, after the formation of interconnect 48 can create unwanted current leakage paths resulting in poor device performance and possibly complete failure. The formation of silicide region 40 in contact surface 34 provides an etch resistant material in the buried contact region which enables the etch to be carried out for an amount of time sufficient to remove all of the polysilicon not protected by photolithographic mask 46.

The substrate surface protection provided by silicide region 40 is also useful in fabrication processes having additional subsequent polysilicon etching steps such as those using removable sidewall spacers on transistor gate electrodes. For example, in advanced MOS devices having a lightly-doped-drain-structure (LDD), it is sometimes advantageous to form the lightly doped source and drain region after forming the heavily doped source and drain regions. In such an LDD formation process, after buried contact formation, polysilicon sidewall spacers are formed on the transistor gate electrodes and must be removed after implanting the substrate to form the heavily doped source and drain structure. In a device having buried contacts formed according to the prior art, additional trenching of the substrate can occur during such removal of the polysilicon sidewall spacers.

Thus it is apparent that there has been provided, in accordance with the invention, a method for forming a buried contact in a semiconductor device which fully meets the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. For example, additional impurity doping steps can be performed to change the electrical conductivity of the substrate or decrease the electrical resistance or both. It is therefore intended to include within the invention all such variations and modifications as fall within the scope of the appended claims and equivalents thereof.

I claim:

1. A method for forming a buried contact in a semiconductor device comprising:

providing a silicon substrate having a dielectric layer, a first conductive layer and an insulating layer formed sequentially thereon;

forming an opening through the insulating layer, the first conductive layer, and the dielectric layer exposing a selected portion of the silicon substrate;

forming a metal silicide in the selected portion of the substrate;

removing the insulating layer;

depositing a second conductive layer onto the first conductive layer and the metal silicide; and selectively etching the second conductive layer preferentially to the metal silicide to form a portion thereof making an electrical contact to the substrate and leaving exposed a portion of the metal silicide.

2. The method of claim 1 wherein selectively etching the conductor comprises:

forming a photoresist pattern on the conductor aligned to the selected portion of the substrate; and anisotropically etching the conductor using the photoresist pattern as an etch mask and the refractory metal silicide as an etch stop.

3. The method of claim 1 wherein forming a metal silicide comprises;

selectively depositing a refractory metal on the selected surface portion; and annealing the substrate to form a refractory metal silicide.

4. A method for forming a buried contact in a semiconductor device comprising:

providing a silicon substrate having a dielectric layer, a first conductive layer and an insulating layer formed sequentially thereon;

forming an opening through the insulating layer, the first conductive layer, and the dielectric layer exposing a selected portion of the silicon substrate;

depositing a layer of cobalt to overlie the substrate;

annealing the substrate at a temperature of about 430° to 470°C. for about 10 to 60 seconds to react a portion of the cobalt layer with silicon in the exposed portion of the substrate to form cobalt silicide;

etching away unreacted cobalt;

performing a second anneal at a temperature of about 650° to 750° C. for about 10 to 60 seconds;

removing the insulating layer;

depositing a second conductive layer onto the first conductive layer and the cobalt silicide; and selectively etching the second conductive layer preferentially to the cobalt silicide to form a portion thereof making an electrical contact to the substrate and leaving exposed a portion of the cobalt silicide.

5. A method for forming a buried contact in a semiconductor device comprising:

providing a silicon substrate having a dielectric layer, a first polysilicon layer and an insulating layer formed sequentially thereon;

forming an opening through the insulating layer, the first polysilicon layer, and the dielectric layer exposing a selected portion of the silicon substrate;

forming a metal silicide selected from the group consisting of cobalt silicide and tantalum silicide in the selected portion of the substrate;

removing the insulating layer;

depositing a second polysilicon layer onto the first conductive layer and the metal silicide; and selectively etching the second polysilicon layer preferentially to the metal silicide to form a portion thereof making an electrical contact to the substrate and leaving exposed a portion of the metal silicide.

6. A method for forming a buried contact in a semiconductor device comprising:

providing a silicon substrate having principal surface;

forming a dielectric layer on the principal surface;

depositing a first silicon layer onto the dielectric layer;

depositing an insulating layer onto the first silicon layer;

sequentially etching the insulating layer, the first silicon layer and the dielectric layer to form an opening exposing a contact region on the principal surface;

forming a sidewall spacer on the perimeter of the opening;

forming a refractory metal silicide in the contact region;

removing the insulating layer and the sidewall spacer;

depositing a second silicon layer onto the first silicon layer and the refractory metal silicide;

forming a photoresist mask overlying the second silicon layer aligned to the contact region; and anisotropically etching the second silicon layer and the first silicon layer using the photoresist mask as an etch mask and the refractory metal silicide as an etch stop to form an electrical contact to the substrate while leaving exposed a portion of the contact region at the principal surface.

7. The method of claim 6 wherein forming a refractory metal silicide comprises:

depositing a layer of cobalt onto the contact region;

annealing the substrate at a temperature of about 430° to 470° C. for about 10 to 60 seconds to react a portion of the cobalt layer with silicon in the contact region;

etching away unreacted cobalt; and performing a second anneal at a temperature of about 650° to 750° C. for about 10 to 60 seconds.

8. The method of claim 6 wherein forming a metal silicide comprises;

selectively depositing a refractory metal on the selected surface portion; and annealing the substrate to form a refractory metal silicide.

* * * * *